United States Patent [19]

Schlereth

[11] B 3,982,112

[45] Sept. 21, 1976

[54] RECURSIVE NUMERICAL PROCESSOR

[75] Inventor: Fritz H. Schlereth, Baldwinsville, N.Y.

[73] Assignee: General Electric Company, Syracuse, N.Y.

[22] Filed: Dec. 23, 1974

[21] Appl. No.: 536,009

[44] Published under the second Trial Voluntary Protest Program on January 27, 1976 as document No. B 536,009.

[52] U.S. Cl. .............................. 235/156; 235/152; 235/164
[51] Int. Cl.² .......................................... G06F 7/38
[58] Field of Search ........... 235/152, 156, 164, 176; 328/167

[56]         References Cited
          UNITED STATES PATENTS

| | | | |
|---|---|---|---|
| 3,609,568 | 9/1971 | Jackson | 235/156 X |
| 3,699,326 | 10/1972 | Kindell et al. | 235/176 X |
| 3,725,687 | 4/1973 | Heightley | 235/164 |

*Primary Examiner*—Joseph F. Ruggiero
*Assistant Examiner*—Jerry Smith
*Attorney, Agent, or Firm*—Richard V. Lang; Carl W. Baker; Frank L. Neuhauser

[57]                ABSTRACT

The invention relates to a recursive numerical processor for data in word serial form in which bias errors are reduced by use of a property of two's complement notation. The input data is introduced in two's complement notation. The processor includes a sub-processor, typically a multiplier, introducing a bias error on the order of the least significant bit. The bias error arises from truncation or rounding necessary to avoid word growth in the processor. In accordance with the invention, the sub-processor is provided with a sign inverter at its input and at its output and the two sign inverters perform a double sign inversion on alternate words. Alternate word sign switching causes the error to alternate between being too large and too small (in magnitude), a property of two's complement notation, thus cancelling a very substantial part of the bias error. The invention has application to a number of recursive numerical processors including recursive digital filters.

7 Claims, 6 Drawing Figures

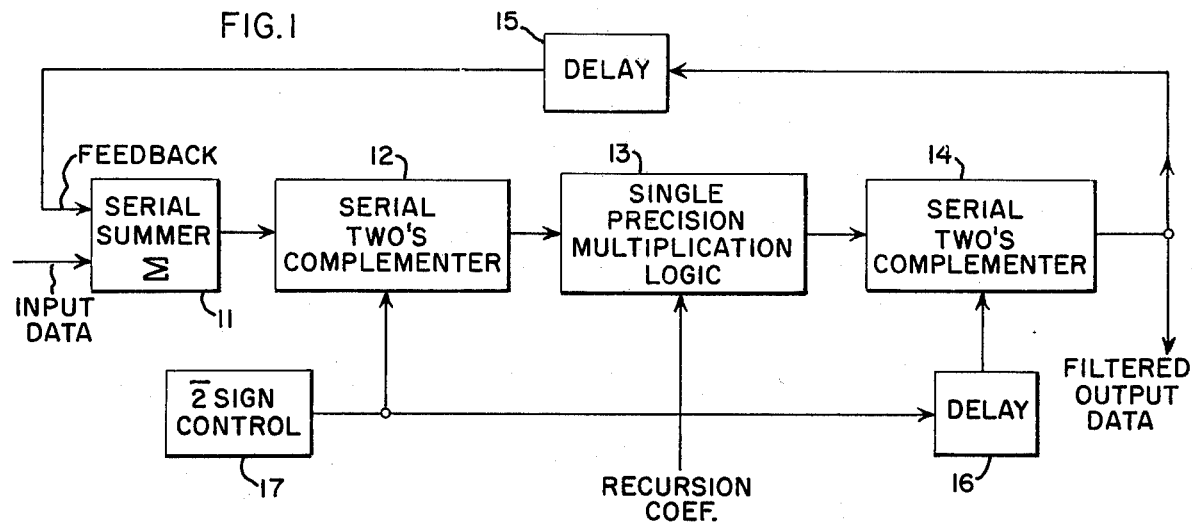
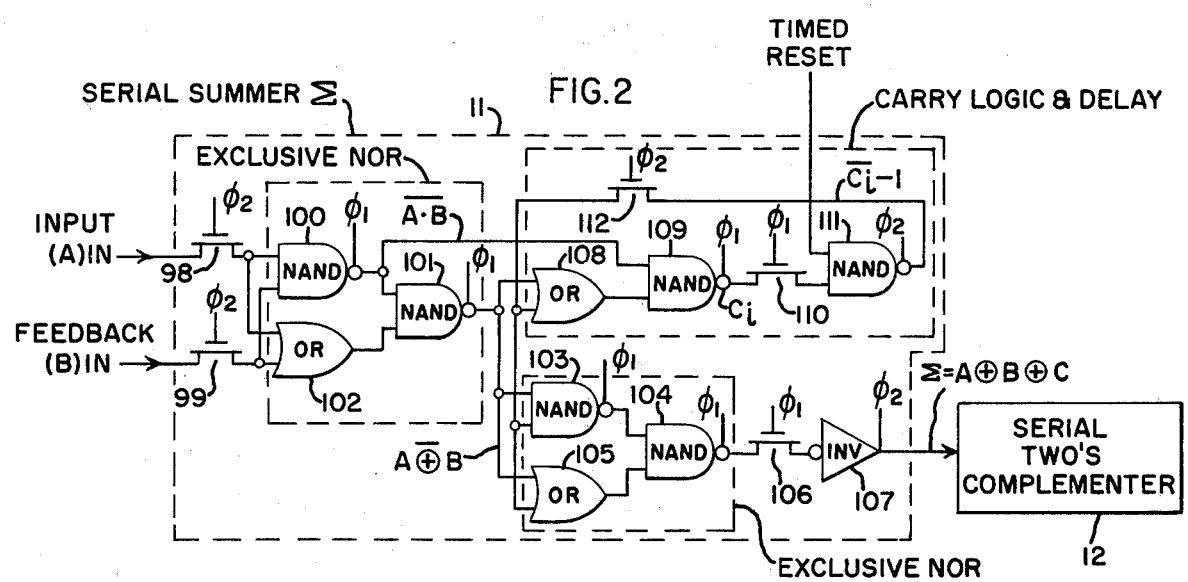
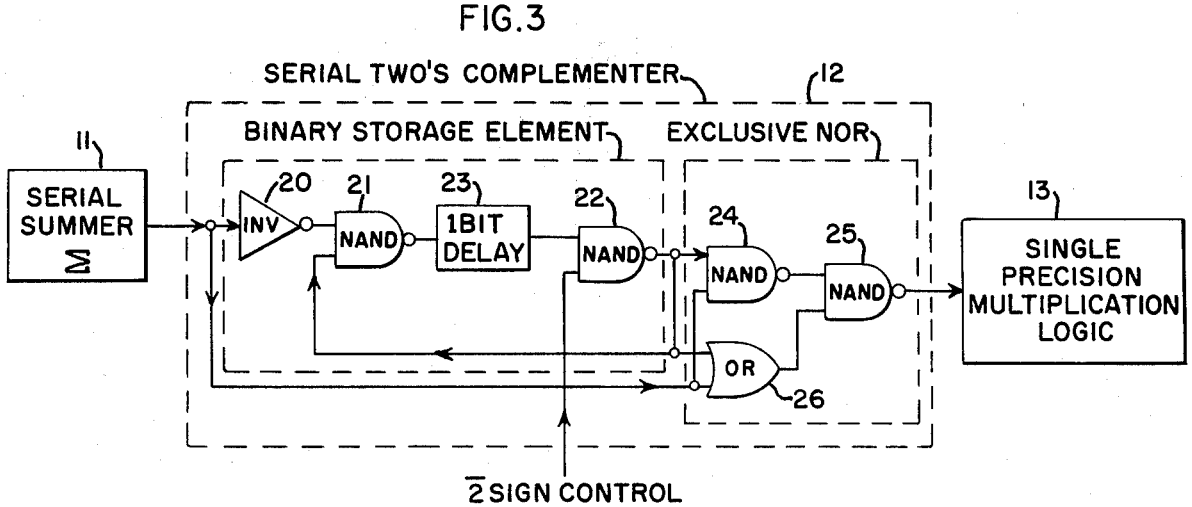

RECURSIVE NUMERICAL PROCESSOR

BACKGROUND OF THE INVENTION

1. Field of the Invention

The present invention relates to the field of digital computation and more particularly to the recursive processing of a time series of digital data. Digital filtering is one important category of recursive processing.

2. Description of the Prior Art

Recursive digital filters are well known. In general they involve multiplication and addition operations on numerical sequences in order to produce new numerical sequences. In such recursive filters, the output sequence is fed back and combined and the input sequence. The values of the terms of the sequence are necessarily quantized to a fixed number of bits, and thus as part of the filtering operation it is necessary to round or truncate in order to make the number of bits at the output equal to the number of bits at the input. This rounding or truncation introduces an error (noise) into the filter. This error is random in nature. Of particular concern is the bias (DC) portion of the error, which is troublesome in recursive low pass filters. In such filters any bias error is fed back to the input and tends to magnify the error because of error integration.

SUMMARY OF THE INVENTION

Accordingly, it is an object of the present invention to provide an improved recursive processor.

It is another object of the present invention to provide an improved recursive digital filter.

It is a further object of the present invention to provide an improved recursive digital filter in which the bias error is reduced.

These and other objects of the present invention are achieved in a recursive processor subject to error integration. The novel combination comprises input terminal means for connection to a source of binary input data representing a time series, with the input data being expressed in successive words in two's complement notation. The input data is coupled to a first two's complementer for sign inversion in response to a control signal. A numeric sub-processor, typically a multiplicationn device, is coupled to the output of the first two's complementer. The sub-processor is subject to a bias error which is correlated with the sign of the input data. At the output of the sub-processor a second two's complementer is provided for a second inversion in response to a control signal. Control means are further provided coupled to the control inputs of the two two's complementers to invert and reinvert, respectively, the sign of alternate words of the data stream. At the output of the second two's complementer, the sign of the data stream remains unchanged while the bias error is substantially cancelled.

The bias error in the numeric sub-processor may arise from truncation of the least significant bits to reduce the word length in the processed output or the bias error may arise from biased rounding wherein a rounding value is added and the least significant bit(s) are truncated, with the combination producing a bias error.

The sub-processor in a recursive filter typically performs multiplication with the bias error arising either within the multiplication device per se or in a subsequent summation device. Thus, the multiplication device may provide a biased truncation and/or rounding necessary to obtaining a single precision product, or the sub-processor may include a double precision multiplication device, itself without error, followed by a summation means in which biased truncation and/or rounding takes place.

When the recursive processor is a digital filter, a summer for data in two's complement notation is provided having two inputs and an output with the input data stream being coupled to one of its inputs, its summed output being coupled to the input of the first two's complementer. Delay means are also provided for coupling the output of the second two's complementer to the second input of the summer after a delay of one word, the delay synchronizing the processed output data with the succeeding word of the input data at the summer input. The output of the filter is derived from the output of the second two's complementer.

BRIEF DESCRIPTION OF THE DRAWING:

The novel and distinctive features of the invention are set forth in the claims appended to the present application. The invention itself, however, together with further objects and advantages thereof may best be understood by reference to the following description and the accompanying drawings in which:

FIG. 1 is a block diagram of a recursive digital filter in which means have been introduced to avoid unidirectional offset in accordance with the invention;

FIG. 2 is a logic diagram of a serial summer corresponding to the element 11 in the block diagram of FIG. 1;

FIG. 3 is a logic diagram of a serial two's complementer corresponding to element 13 and subject to a bias error in FIG. 1;

Referring now to FIG. 1, a recursive digital filter in accordance with the invention is shown in block diagram form. In this embodiment, the filter is designed to accept a time series of binary input data in bit serial and word serial format. The filter output is "filtered" in a manner depending upon the design and adjustment of the filter. The input data is in serial form with the words being constituted of bits in two's complement notation in which the least significant bit occurs first in time and the last bit denotes the sign. The filtered output data produced by the filter is in the same form.

Figure 4:
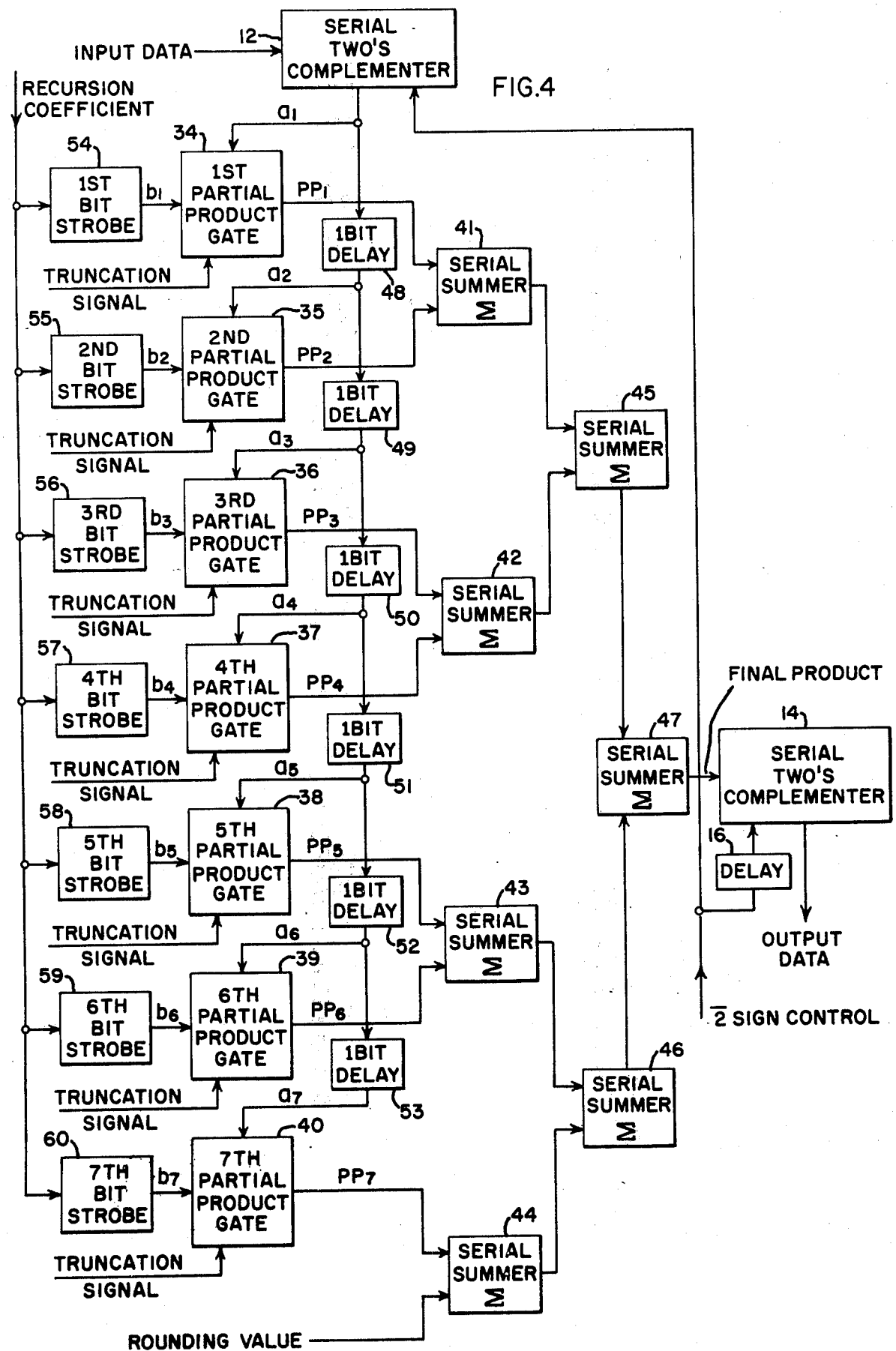
FIG. 4 is a block diagram of the single precision multiplication logic corresponding to element 13 and subject to a bias error in FIG. 1.

The recursive filter comprises a serial summer 11, a first serial two's complementer 12, a single precision multiplier 13 subject to a bias error in the rounding process, a second serial two's complementer 14 in a forward data path, and a delay 15 in a data feedback path. The two's complementers are controlled by a control means 17 and delay 16. As will be developed, appropriate switching of the two's complementers greatly reduce the bias error.

The serial summer 11, the initial member of the block diagram, may take the form illustrated in the logic diagram of FIG. 2. It has two inputs and a single output. The summer 11 is designed to accept two serial data streams, both of which are in two's complement notation, least significant bit first in time, with the sign bit last. The summer combines the two input data streams into a single data stream representing the sum of the two input data streams and also in two's complement notation, least significant bit first in time. The input data to be filtered is coupled to one input of the summer 11, feedback data (obtained in a manner to be described below) is coupled to the other input of the summer and the output of the summer is coupled to the two's complementer 12, the succeeding element in the block diagram of FIG. 1.

The summer cell of FIG. 2 is of a conventional design and may be regarded as formed by three principal blocks shown in dotted outline and several ancillary delays. The principal blocks are a first exclusive NOR comprising the elements 100, 101 and 102, a second exclusive NOR comprising the elements 103, 104 and 105, and the "Carry Logic and Delay" comprising the elements 108, 109, 110, 111 and 112.

The summer cell functions in the following manner. The input (A) and feedback (B) bit streams are applied to the first exclusive NOR. The exclusive NOR is composed of two NAND gates 100, 101 and an OR gate 102. The inputs of 100, 102 are connected in parallel to the A and B bit streams. The outputs of the NAND gate 100 and OR gate 102 are coupled to the two inputs of NAND gate 101. The output ($A \overline{\oplus} B$) of the first exclusive NOR appears at the output of NAND gate 101. Another output ($\overline{A \cdot B}$) is derived from the output of NAND gate 100 and applied to one input of the carry logic and delay block.

The second exclusive NOR of the summer is made up of the NAND gate 103, OR gate 105, and NAND gate 104. The inputs of 103, 105 are paralleled and coupled respectively to the output ($A \overline{\oplus} B$) of the first exclusive NOR and the carry output ($\overline{C}_{i-1}$) of the Carry Logic and Delay block. The outputs of the NAND gate 103 and OR gate 105 are applied respectively to the two inputs of NAND gate 104. The output $(A \oplus B) \oplus \overline{C}_{i-1}$ of the second exclusive NOR appears at the output of NAND gate 104 and is coupled to transmission gate 106 and inverter 107. The summed output $A \oplus B \oplus C$ appears at the output of the inverter 107.

The carry logic and delay is composed of the OR gate 108, NAND gates 109, 111 and transmission gates 110, 112. Gate 108 has one input coupled to the output of ($A \overline{\oplus} B$) of the first exclusive NOR and its output coupled to one input of the NAND gate 109. The other input of the NAND gate 109 is connected to the $\overline{A \cdot B}$ output of NAND gate 100. The output of NAND gate 109 is coupled through the transmission gate 110 to the NAND gate 111, whose other input connection provides the reset function. The output of NAND gate 111 contains the carry $\overline{(C_{i-1})}$ which is delayed and coupled in a feedback path back to the other input of OR gate 108.

The logical function of the summer may be outlined in the following table:

| $\overline{C}_{i-1}$ | B | A | Σ | $C_i$ | $\overline{C}_i$ |
|---|---|---|---|---|---|
| 1 | 0 | 0 | 0 | 0 | 1 |
| 1 | 0 | 1 | 1 | 0 | 1 |
| 1 | 1 | 0 | 1 | 0 | 1 |
| 1 | 1 | 1 | 0 | 1 | 0 |
| 0 | 0 | 0 | 1 | 0 | 1 |
| 0 | 0 | 1 | 0 | 1 | 0 |
| 0 | 1 | 0 | 0 | 1 | 0 |
| 0 | 1 | 1 | 1 | 1 | 0 | where $\overline{C}_i = \overline{A \ B} + (A \oplus B) \overline{C}_{i-1}$;
+ denotes the OR function;
⊕ denotes the exclusive OR function;
$\overline{\oplus}$ denotes the exclusive NOR function;

The output of the summer 11 is coupled to the first serial two's complementer 12. The serial two's complementer 12 may take the form illustrated in the logic diagram of FIG. 3. It has a data input connection, a data output connection and a control connection. The two's complementer is designed to accept a serial data stream in the two's complement notation, least significant bit first, and to produce an output data stream in the same form in which the sign is inverted or uninverted dependent upon the control signal. The data stream applied to the two's complementer input is composed of a series of successive words clocked to occur at a regular rate. The control signal is applied from sign control 17 in synchronism with the progress of the words through the numeric processor. The control is applied as each new word leaves the summer 11 and enters the two's complementer 12.

The logic design of the serial two's complementer is illustrated in FIG. 3. Like the summer illustrated in FIG. 2, it makes preferential use of NAND devices. For simplicity, clocking connections have been omitted. The design provides a minimum geometry configuration when implemented using metal oxide semiconductor field effect transistors (MOSFETS) in large scale integration. As shown by the dotted outlines in FIG. 3, the serial two's complementer is composed of two major blocks, a binary storgae element and an exclusive NOR. In principle, the circuit senses the first 1 in the bit stream and then after a one bit delay, inverts the succeeding bits.

The binary storage element is implemented by an inverter 20, two NAND gates 21, 22, a 1 bit dynamic delay (23). The bit stream from the signed multiplication logic 11 is coupled through inverter 20 to the NAND gate 21, thence through the one bit delay 23 to the NAND gate 22. The other input of the NAND gate 22 provides a sign control input connection. The output of the NAND gate 22 is coupled back to a second input of the NAND gate 21 to provide regeneration for the binary storage element.

The exclusive NOR gate of two's complementer 12 is implemented by two NAND gates 24, 25 and an OR gate 26. The NAND gate 24 and the OR gate 26 each have one input connected to the complementary output of the binary storage element. The other inputs of the NAND gate 24 and the OR gate 26 are connected to receive the bit stream from the serial summer 11. The output of the NAND gate 24 and the OR gate 26 are connected to the separate inputs of the NAND gate 25, at the output of which the negated (or unnegated) output appears.

In the two's complementer, the binary storage element is designed to respond to the first 1 in the input bit stream and to produce a change in output after a one bit delay. The exclusive NOR, which has one input connection coupled to the bit stream from the serial summer 11 and the other to the complementary output of the binary storage element, is designed to invert the input bit stream when the (complementary) output of the binary storage element goes to a zero state. The output of the exclusive NOR provides the negated (or unnegated) number.

Following the two's complementer 12 is the multiplication logic 13, an essential element of the recursive filter. The filtering function, as will be described, is dependent upon the configuration selected and the recursive coefficient introduced as a second operand into the multiplication logic. The inaccuracy of the filtering operation is caused by a truncation or rounding error when single precision products are formed in the multiplication logic. If left uncompensated, an error in the least significant digits may get larger due to error integration.

The single precision multiplication logic may take the form illustrated in the block diagram of FIG. 4. It operates in a mode generally indicated by the sequencing diagram of FIG. 5. The multiplication logic 13 has two data inputs and a single data output. The first data input (the multiplicand) is designed to accept serial input data in two's complement notation, least significant bit first in time, while the second data input (the multiplier) is designed to accept serial input data in magnitude format, least significant bit first in time. The output of the multiplication logic is a consolidated data stream representing the product of the two input quantities ($a \cdot b$) and appearing in two's complement notation, least significant bit first in time. The multiplication logic provides output words of less than double precision — typically "single precision" — arrived at by a rounding process. The rounding, which will be described below, produces a bias error which consistently correlates with the sign of the multiplicand. As a result of a property of numbers in two's complement notation, the bias error for positive multiplicands is consistently opposite to that for negative multiplicands.

Figure 5:
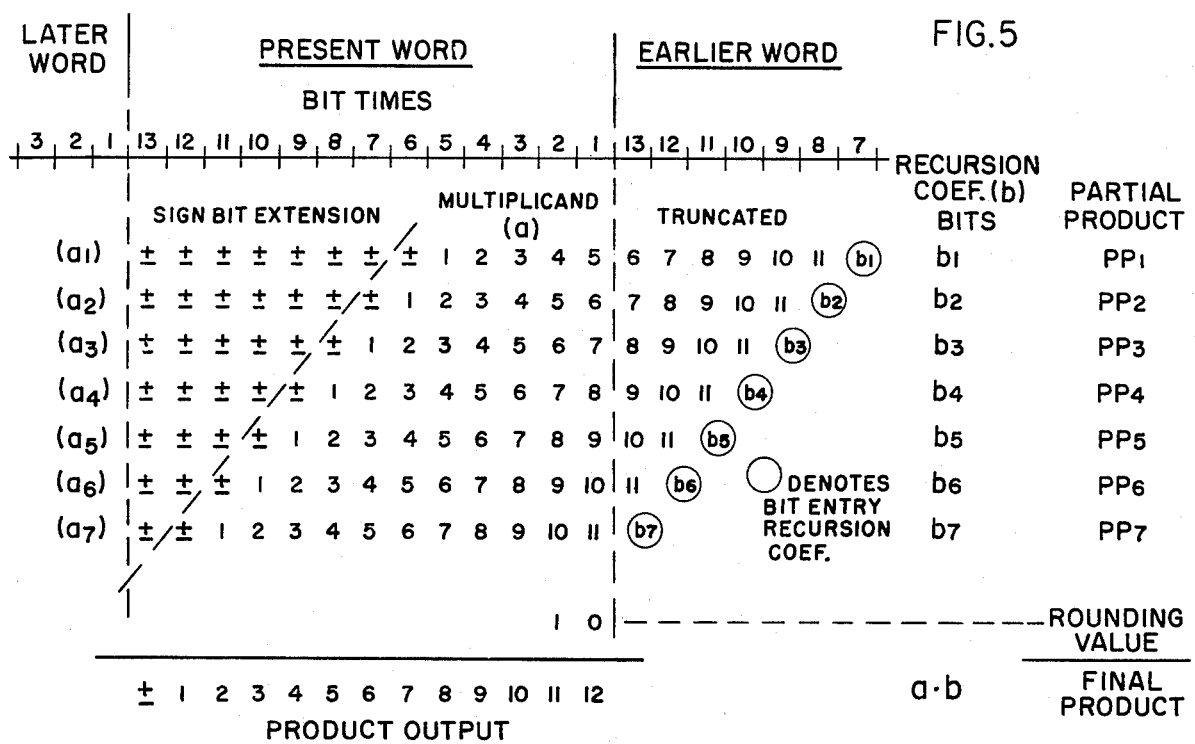
FIG. 5 is a tabulation illustrating the operation of the single precision multiplication logic of FIG. 4 illustrating particular truncation process, which in general produces a bias error in the final product.

The operation of the single precision multiplication logic 13 may best be understood by joint reference to FIGS. 4 and 5. In the following description it is assumed that the recursion coefficient ($b$) of the filter, forming the multiplier, contains seven bits of information which are applied with the least significant bit first in time. The serial input data forming the multiplicand is assumed to be of 12 bits and appears in two's complement notation with the least significant bit first and the sign bit last. The input data stream is assumed to occur at thirteen bit times per word period. A single precision product appears at the output (after a nine bit transport delay) rounded to thirteen bits.

The single precision multiplication logic 13 will now be described. In FIG. 4, the multiplication logic 13 is depicted in a simplified block diagram intended primarily to illustrate the general manner in which the multiplication logic is used recursively. The multiplication logic may be seen to comprise a succession of seven partial product gates 34 through 40; a shift register for the multiplicand ($a$) comprising a succession of one bit delays 48 through 53, a succession of multiplier ($b$) bit strobing means 54 through 60, and a summation tree including serial summers 41 through 47. The final product ($a \cdot b$) appears at the output of summer 47.

The serial input data stream of the multiplicand available from two's complementer 12 is coupled directly to the $a_1$ data input of the initial multiplication gate 34 and is indirectly coupled to each of the $a_i$ data inputs of the multiplication gates 35 to 40 by means of the successive one bit delays 48 through 53 making up the multiplicand shift register. Thus, the multiplicand data stream directly available at the input of 34 is transferred with one bit delay in 48 to the $a_2$ data input of multiplication gate 35. Similarly, the multiplicand is transferred to each of the remaining multiplication gates 36–40 after additional one bit delays.

The recursion coefficient ($b$) is the multiplier. The individual bits of the recursion coefficient are successively selected by a succession of bit strobes 54 through 60 for formation of the partial product at a given partial product gate. The bit selected by a given strobe corresponds to the sequential position of the gate in FIG. 4. Thus, the bits 1 to 7 of the recursion coefficient are selected in partial product gates 34 through 40, respectively.

A third input to each partial product gate is a truncation signal progressively altered as the gate is associated with successively more significant bits in the multiplier. The truncation signal truncates those bits of the multiplicand which in forming a partial product are of lesser significance than the least significant bit of the final product.

The partial product formed in the partial product gates 34 through 40 are supplied to the first rank (41 through 44) of summer cells. In particular, the partial product outputs (PP1 and PP2) gates 34 and 35 are applied to the two inputs of the serial summer cell 41; the partial product outputs (PP3 and PP4) of gates 36 and 37 are applied to the two inputs of summer 42, similar outputs (PP5 and PP6 of gates 38 and 39 are applied to the two inputs of summer cell 43 and finally, the partial product output (PP7) of the last gate 40 is applied, together with a rounding value to compensate for truncation, to the two inputs of the last (44) of the first rank of summer cells.

The partial products PP1 to PP7 and the rounding value are combined in the summer cells 41 through 47 to obtain the final product. The summers 41 through 47 are arranged in a three rank tree. The summers of the first rank (41 through 44) each provide a single data stream whose value is the sum of the two input data streams. The output data streams of the summer cells 41 and 42 in the first rank are applied to the separate inputs of summer cell 45. The outputs of the second rank summer cells 45 and 46 are then applied to the separate inputs of the third rank summer cell 47. The consolidated data stream representing the single precision product ($a \cdot b$) appears at the output of the serial summer 47 after a transport delay of 9 bits.

A more particularized understanding of the bias error which arises from the truncation and addition of a rounding value in forming a simple precision product may be obtained from further consideration of the sequencing diagram of FIG. 5. The tabulation shows the truncation of the multiplicand and the addition of the rounding value to compensate for multiplicand truncation.

The multiplicand and multiplier positions are plotted in FIG. 5 against arbitrary bit times at the thirteen bit time word rate. The sequencing diagram assumes a 12 bit multiplicand $a$ occuring during the present thirteen bit product word and a 7 bit ($b1$ to $b7$) multiplier $b$. Arbitrary bit times of the present word of the product are indicated at the top of the diagram. Time $T_1$ corresponds to initiation of partial product summing using summers 41 – 47 of FIG. 4. The time increases from right to left so that numeric values can be written in natural order with the least significant bit on the right. The word earlier than the present word thus appears to the right in the diagram and the word later than the present word appears to the left in the diagram.

The same multiplicand word having eleven low order bits and a sign bit in two's complement notation is tabulated in FIG. 5 at a succession of seven positions referenced with respect to the bit times $T_1$ to $T_{13}$. In the serial data format applicable to the arithmetic processes herein, the least significant bit is first in time and the last bit is a sign bit. In the uppermost tabulation of the multiplicand, the bit numbers 5 through 1 and the sign bit of the multiplicand occur within the bits times $T_1$ to $T_6$ of the "present" word. In the second tabulation, the multiplicand is displaced one bit to the left (or later in time), and the magnitude bits 6 through 1 and the sign bit occur during the times $T_1$ through $T_7$ of the present word. In each successive tabulation, the multiplicand is displaced one bit to the left. In the seventh and last tabulation, the magnitude bits 11 through 1 and the sign bit occur in the bit times $T_1$ through $T_{12}$ of the "present" word. The successively displaced tabulations illustrate the passage of a word of the multiplicand through successive stages of the shift register. The truncation signal removes all bits of the multiplicand occuring prior to $T_1$ of the present word.

The recursion coefficient (the multiplier) is tabulated in a column one bit at a time with the bits aligned with successively displaced tabulations of the "present" multiplicand word. The recursion coefficient is entered one bit at a time, least significant bit first, during the time $T_7$ to $T_{13}$ of the prior word time as denoted on the diagram of the circled bits $b_1$ to $b_7$. In the partial product gate, the entered bits are strobed and stored in the strobes 59 through 66 while the untruncated part of the multiplicand word is accessed from a stage of the shift register. The diagram thus illustrates truncation within the multiplication logic to achieve a single precision product. (If a double precision product is obtained, the full 12 bit multiplicand word is used in formation of each partial product and the word length grows to 19 bits, assuming 7 bits in the recursion coefficient.)

FIG. 5 further illustrates that in forming a single precision product, the multiplicand is truncated so that all bits contributing less than a given value to the final product are discarded. Thus, consistent with normal multiplication, bits in the tabulations of the multiplicand are shifted to bit times corresponding to their value and added. Those occuring before an arbitrary bit time (e.g., $T_1$) and thus of less than a given significance, are truncated and take no part in forming the individual partial products.

The formation of the final single precision product from the truncated partial products PP1 to PP7 is accompanied by the addition of a rounding value of 2, approximately compensating for the statistical average of the numbers truncated in the multiplicand. The final product $a \cdot b$ at the final serial summer 47 is in a 12 bit, two's complement format occuring at thirteen bit times per word as was the input data stream. It is now coupled to the second two's complementer 14.

The truncation in the formation of the partial products produces an error which has a fixed bias. Let us assume that only positive numbers are involved in the multiplicand and that the distribution is a uniform one, i.e., that it is equally likely that any bit in the truncation triangle be a 1 or a 0. To correct the bias introduced by truncation to a positive number, a fixed rounding value may be subtracted equal to the bias error to within the nearest least significant bit of the output product. The bias error introduced by the truncation is dependent upon the value of the recursion coefficient, which is normally fixed to achieve a given filter function. Preferably the bias error due to truncation is calculated with a prior knowledge of the recursion coefficient, and the rounding value is selected at the largest digit below the bias error. Rounding accuracy to the least significant bit is normally adequate when the multiplication is performed once. If, however, as the present invention contemplates, the numbers are used recursively and the rounding off produces a fixed bias consistently just below (or just above) the correct value, then the recursive use of the processor output may greatly worsen the effect of the error. A reduction in the bias error is achieved by the use of the two's complementers in a manner which will be considered after the remaining elements in the FIG. 1 embodiment have been treated.

A second two's complementer 14 identical to the first two's complementer 12 is coupled to the output of the single precision multiplier 13. It has its control input coupled through delay 16 to the sign control 17. At its output it produces a serial data stream in which the sign is also changed for alternate words. Since the successive elements 12 and 13 introduce a delay (typically about 10 bits) to the serial data stream, the sign control signal coupled to the first two's complementer must be delayed a like amount before being coupled to the second two's complementer.

The output of the second two's complementer is then coupled back through the delay 15 to the input of the input summer. The delay 15 is typically a shift register whose delay time in bits is selected to take into account the propagation delay in bits required for passage of the bit stream through the elements 11 through 14. This delay allows the word appearing at the output of the two's complementer 14 to be re-introduced in synchronism with the next word in the input data stream. Thus, if the propagation delay through the elements 11 through 14 is less than a word by one or two bits, the delay 16 will provide the one or two bits of delay to achieve synchronism.

Assuming that recursion is taking place, as the second input word is introduced into the summer, it is summed in synchronism with the first output from 14. The new summed quantity proceeds through the elements 12, 13 and 14 to the output of 14 and is reintroduced at the input of the summer 11. After some arbitrary number of recursions, the filter output will reach a non-transient condition and the output will be characterized as digitally filtered. The output may be expressed as $$Y_n = X_n + \left(\frac{a}{1-a}\right) Y_n - 1$$

where
$Y$ is the output quantity, $X$ is the input quantity, $n$ is the number or recursions, and $a$ is the recursion coefficient.

Assuming that there are a plurality of recursions ($n>1$), one may expect a unidirectional bias error which is greater than the least significant bit tolerated in a single multiplication. Thus, while an error no greater than the least significant bit of the bit stream may be tolerated in a non-recursive operation, the growth of the absolute value of the bias error in a recursive operation makes it important that the bias error be further reduced. The presence of the two two's complementers in FIG. 1 bring about the desired further reduction in the unidirectional offset.

This reduction in unidirectional error arised from a property of two's complement arithmetic which permits one to invert the direction of the unidirectional offset and cause it to cancel. This property may be explained by resort to the table below which tabulates in two's complement notation successive numbers having integer values from 7 to 0 and from 0 to −8.

| | | | |
|---|---|---|---|
| 0111 | 7 | 0000 | 0 |
| 0110 | 6 | 1111 | −1 |
| 0101 | 5 | 1110 | −2 |
| 0100 | 4 | 1101 | −3 |
| 0011 | 3 | 1100 | −4 |
| 0010 | 2 | 1011 | −5 |
| 0001 | 1 | 1010 | −6 |
| 0000 | 0 | 1001 | −7 |
| | | 1000 | −8 |

Let us assume that a rounding value is too small by one bit. The effect of being one bit too small is that of subtracting a 1 at the least significant bit in the positive number. If the true number is a +7 (0111), then an error producing a loss of the least significant bit will reduce the output value to a 6 (0110). If the true number is negative, i.e., a −7, in two's complement notation (1001), then an error producing a loss of the least significant bit will increase the magnitude of the output to a −8 (1000). In short, if the number is positive in two's complement notation, the error reduces the magnitude of the rounded value, while if the number is negative in two's complement notation, the error increases the magnitude of the rounded value.

In accordance with the invention, the sign of the number is changed before and after the operation which introduces the bias error on alternate words. Because of the double sign inversion, the effect on the sign is self-cancelling, while the unidirectional or "bias" component of the error is greatly reduced and in some cases completely eliminated.

The arrangement illustrated in FIG. 1 is exemplary of one manner in which a bias error may arise. In FIG. 1, the bias error arises within the multiplication logic. The bias error may also occur in a rounding or in a truncation step performed after multiplication as in FIG. 6, in which the multiplication logic is without error and operates at full double precision.

Figure 6:
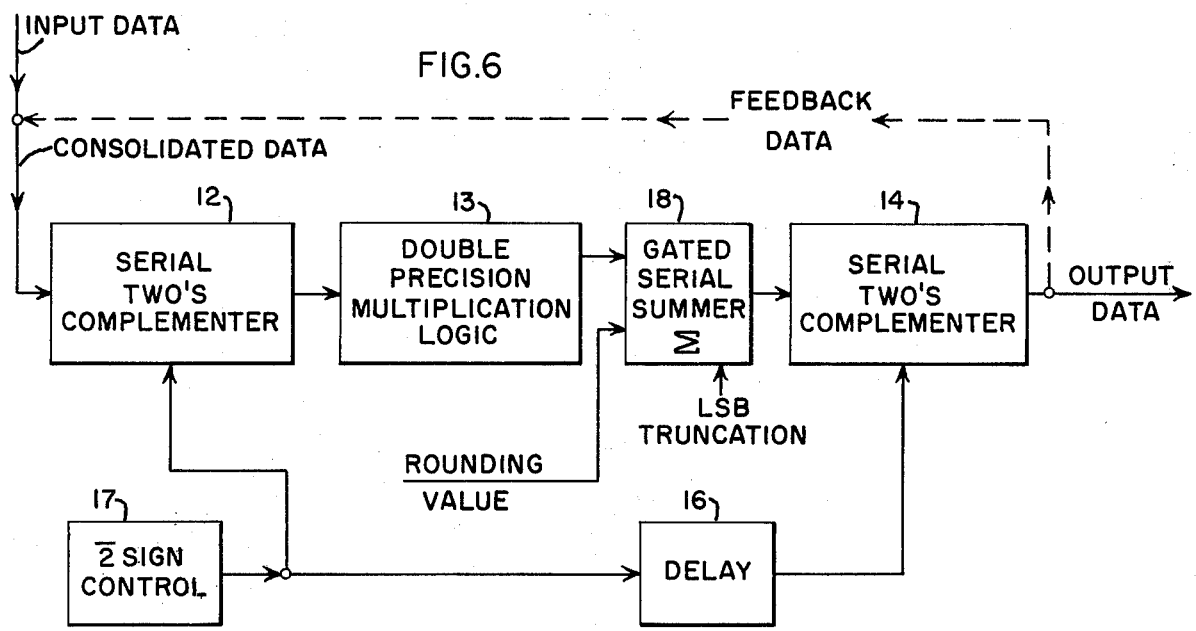
FIG. 6 is a block diagram of a portion of a recursive filter in which a double precision multiplication is provided followed by a summation device in which truncation or rounding takes place giving rise to a bias error.

FIG. 6 illustrates a portion of a second single pole recursive filter of the same general nature as illustrated in FIG. 1. The illustrated portion includes only the initial serial two's complementer 12, a double precision multiplication logic 13' (having no error), a gated serial summer 18, which follows the double precision logic, and the second serial two's complementer 14, which is coupled back to the output of the gated serial summer 18. Output data derived at the output of the second serial two's complementer 14 is fed back (by means not shown) and consolidated at the input of the initial serial two's complementer. The sign control 17 and delay element 16 are as before. The double precision multiplication logic 13 will produce an output word of 19 bits, equal to the sum of the bits of the multiplicand (12) and the multiplier (7). The nineteen bit word is then applied to the gated serial summer 18, which adds a rounding value approximating the truncation, and then gates out the last seven bits to reduce the word length to that of the input data. If an exact rounding value does not exist, then a bias error similar to that noted in respect to FIG. 1 will occur, and the sign switching will reduce that error substantially.

Three practical examples of error reduction in single pole filters having differing recursive coefficients are indicated below. The first is a low pass filter; the second is a filter operating close to integration and the last is a pure integrator.

First example:

$$Y_n = X_n + \frac{100}{128} Y_{n-1}$$

| SAMPLE NO. | CORRECT ANSWER | ERROR WITHOUT SIGN REVERSAL $\times 10^{+3}$ | ERROR WITH SIGN REVERSAL $\times 10^{+3}$ |
|---|---|---|---|
| 0 | .218 | 0 | 0 |
| 5 | .772 | 1.65 | .375 |
| 10 | .933 | 2.11 | −.235 |
| 15 | .980 | 2.24 | .319 |
| 20 | .995 | 2.27 | −.290 |
| 25 | .997 | 2.14 | .225 |
| 30 | .999 | 2.27 | −.07 |

Second example:

$$Y_n = X_n + \frac{127}{128} Y_{n-1}$$

| SAMPLE NO. | CORRECT ANSWER | ERROR WITHOUT SIGN REVERSAL $\times 10^{+3}$ | ERROR WITH SIGN REVERSAL $\times 10^{+3}$ |
|---|---|---|---|
| 0 | $7.80 \times 10^{-3}$ | 0 | 0 |
| 25 | .184 | .268 | .0290 |
| 50 | .329 | .500 | −.0213 |
| 100 | .546 | .762 | −.0383 |
| 200 | .792 | 1.16 | −.0350 |
| 300 | .904 | 1.32 | −.0310 |
| 400 | .955 | 1.34 | −.0171 |
| 500 | .979 | 1.42 | −.0329 |
| 600 | .990 | 1.48 | −.005 |
| 700 | .994 | 1.42 | .002 |
| 800 | .997 | 1.40 | .05 |

Third example:

$$Y_n = X_n + Y_{n-1}$$

| SAMPLE NO. | CORRECT ANSWER | ERROR WITHOUT SIGN REVERSAL $\times 10^{+3}$ | ERROR WITH SIGN REVERSAL $\times 10^{+3}$ |
|---|---|---|---|
| 0 | $1.99 \times 10^{-3}$ | 0 | 0 |
| 25 | .05 | .146 | .005 |
| 50 | .102 | .292 | 0 |
| 100 | .201 | .586 | 0 |
| 200 | .401 | 1.17 | 0 |
| 300 | .601 | 1.75 | 0 |
| 400 | .801 | 2.34 | 0 |
| 499 | .999 | 2.92 | .005 |
| 500 | 1.001 | 2.93 | 0 |

In each of the above examples the input sequence consists of 1's (unit step) and the computer run was terminated when the output reached to within 1 percent of the final value. In the case of the pure integrator the simulation was halted when the output exceeded 1.00.

The reduction in output bias is on the order of a factor of ten. In the case of the pure integrator (example 3), the even numbered samples are exact while the odd numbered samples have a small error.

The arrangements described represent a very simple method for reducing the bias error of a digital filter utilizing a digital multiplier.

While the examples given are for single pole filters, the technique applies to filters of greater complexity including those used for low pass, high pass, and band pass applications.

The invention has been described in two embodiments in which the input and output data are in a bit serial, word serial time series. The invention may also be carried out where the bits of each word are in parallel while the words are in a time series.

In two's complement notation, the bit positions in bit parallel denote both magnitude and sign in the same manner as the bit times in bit serial denote both magnitude and sign. Each element of FIG. 1 or FIG. 6 may then be of a type designed for bit parallel word serial operation.

What is claimed as new and desired to be secured by Letters Patent of the United States is:

1. In a recursive processor subject to error integration, the combination comprising:
   a. input terminal means for connection to a source of input data representing a time series, said input data being expressed in successive words in two's complement notation,
   b. a first two's complementer to which said input data from said input terminal means is coupled for inverting the sign of serial words coupled thereto in two's complement notation in response to a control signal,
   c. a numeric sub-processor coupled to the output of said first two's complementer for accepting input data in two's complement notation, said sub-processor being subject to a bias error which is consistently correlated with the sign of the input data,
   d. a second two's complementer to which the output of said subprocessor is coupled for inverting the sign of serial words coupled thereto in two's complement notation in response to a control signal, and
   e. control means coupled to the control input of said first and second two's complementers to invert and reinvert respectively the sign of alternate words to substantially cancel said bias error without changing the sign of the output data stream.

2. The combination set forth in claim 1 wherein said sub-processor truncates the least significant bits to reduce word length in the processed output, said truncation producing said bias error.

3. The combination set forth in claim 1 wherein said sub-processor is subject to biased rounding, including the addition of a rounding value and truncation of the least significant bits to reduce word length in the processed output, said combination of a rounding value and truncation producing said bias error.

4. The combination set forth in claim 3 wherein said sub-processor is a multiplier.

5. The combination set forth in claim 4 wherein said sub-processor is a multiplier in which the final product is an approximation to the exact product as a result of truncation and/or rounding of each partial product.

6. The combination as set forth in claim 5 wherein said recursive processor is a digital filter, and having in addition thereto:
   a. a summer for data in two's complement notation, having two inputs and an output at which the sum of the two inputs appears, data from said input terminal means being coupled to one of said inputs, the summed output being coupled to the input of said first two's complementer,
   b. delay means coupling the output of said second two's complementer to said second input of said summer after a delay of one word, to cause the processed output data from said second two's complementer to be summed in synchronism with the succeeding word of the input data, and
   c. output terminal means coupled to the output of said second two's complementer for deriving the filtered digital data.

7. The combination set forth in claim 3 wherein said sub-processor comprises a double precision multiplier and summation device in which the least significant bits are truncated and to which a rounding value inexactly compensating the truncation is added.

* * * * *